United States Patent [19]
Abadeer et al.

[11] Patent Number: 5,929,667
[45] Date of Patent: Jul. 27, 1999

[54] METHOD AND APPARATUS FOR PROTECTING CIRCUITS SUBJECTED TO HIGH VOLTAGE

[75] Inventors: Wagdi W. Abadeer, Jericho; George Maria Braceras, Colchester; John Connor, Burlington, all of Vt.; Donald Albert Evans, Allentown, Pa.

[73] Assignee: International Business Machines Corporation, Armonk, N.Y.

[21] Appl. No.: 08/872,374

[22] Filed: Jun. 10, 1997

[51] Int. Cl.⁶ .................................................. H03K 3/00
[52] U.S. Cl. ............................................ 327/112; 326/83
[58] Field of Search .................................... 327/108, 112, 327/198, 374–377, 379, 389, 427, 434, 437, 530, 538, 540, 541, 543, 545; 326/85–87, 56, 57, 58

[56] References Cited

U.S. PATENT DOCUMENTS

| | | | |
|---|---|---|---|
| 4,689,504 | 8/1987 | Raghunathan et al. | 326/81 |
| 4,782,250 | 11/1988 | Adams et al. | 327/108 |
| 5,262,779 | 11/1993 | Sauer | 341/161 |
| 5,272,481 | 12/1993 | Sauer | 341/165 |
| 5,300,835 | 4/1994 | Assar et al. | 326/68 |
| 5,387,826 | 2/1995 | Shay et al. | 326/21 |
| 5,440,244 | 8/1995 | Richter et al. | 326/37 |
| 5,440,249 | 8/1995 | Schucker et al. | 326/81 |
| 5,510,731 | 4/1996 | Dingwall | 326/63 |
| 5,537,060 | 7/1996 | Baek | 326/87 |
| 5,576,635 | 11/1996 | Partovi et al. | 326/27 |
| 5,604,449 | 2/1997 | Erhart et al. | 326/81 |

*Primary Examiner*—My-Trang Nu Ton
*Attorney, Agent, or Firm*—Ratner & Prestia; Tiffany L. Townsend

[57] ABSTRACT

A CMOS off-chip driver circuit and a method of operating the circuit are provided. The circuit has two pull-down transistors and two pull-up transistors, each pull-up transistor has a gate. A voltage source provides voltage at a logic-high output voltage of approximately 3.3 volts. An output terminal is provided. Initially, a logic-low output voltage is applied to the gate of each of the two pull-up transistors. A condition is detected in which the voltage of the output terminal is greater than a predetermined threshold voltage. The predetermined threshold voltage is between approximately 2.5 volts and approximately 3.3 volts. The voltage applied to the gate of each of the pull-up transistors is raised to an intermediate level that is greater than the logic-low output voltage and less than the logic-high output voltage while the condition is detected. The intermediate level may be approximately 1.5 volts. A clamping mechanism is provided for sinking current from the output terminal to the voltage source, when the voltage of the output terminal is greater than the logic-high output voltage. The clamping mechanism sources current to the output terminal from a ground conductor that provides the logic-low output voltage to the pull-down transistor, when the voltage of the output terminal is less than the logic-low output voltage.

15 Claims, 5 Drawing Sheets

METHOD AND APPARATUS FOR PROTECTING CIRCUITS SUBJECTED TO HIGH VOLTAGE

FIELD OF THE INVENTION

The present invention is related to solid state circuits generally, and more specifically to overvoltage protection circuits for off chip driver circuits.

BACKGROUND OF THE INVENTION

In advanced logic and memory applications using Complementary Metal Oxide Semiconductor (CMOS) technology (such as static random access memory or SRAM), an Off Chip Driver (OCD) driver circuit may be provided. The OCD is coupled to a system bus that is shared with other components that are also coupled to the same bus.

CMOS is the most widely used technology for integrated circuits today. A CMOS device is a compound device including at least one P-Metal Oxide Semiconductor Field Effect Transistor (p-MOSFET or PFET) and at least one N-Metal Oxide Semiconductor Field Effect Transistor (n-MOSFET or NFET). Typically, one NFET is coupled between the output node and the ground, and one PFET is coupled between the output node and the power supply voltage VDD. Each of NFETs and PFETs includes a metal (or polysilicon) gate electrode, a doped silicon channel, and an oxide dielectric layer separating the gate electrode from the channel.

In a system having a mixed signal interface, the various CMOS devices that are coupled to the system bus may operate at a variety of voltage levels. For example, the power supply voltage VDD for a static random access memory (SRAM) may be 1.8 Volts, while another device coupled to the bus may operate at a voltage up to about 5 volts, depending on the type of device.

Protecting the thin dielectric gate electrode films from an over-voltage condition is desirable when the CMOS device interfaces to a bus that is also coupled to other devices which operate at higher voltages. Otherwise, severe device degradation and gate oxide failure may result. Gate dielectric time to breakdown is a function of oxide thickness, over-voltage magnitude and duty cycle, junction temperature, number of chip power on hours (POH), and the total oxide area exposed to the over voltage stress. This dielectric breakdown is one of the major causes of device failure for CMOS devices.

FIG. 5 corresponds to FIG. 1 of U.S. Pat. No. 4,782,250 issued to Adams et al. (hereinafter referred to as "Adams et al."). Adams et al. describe a CMOS Off-Chip Driver (OCD) fabricated in a 3.3 Volt technology (VDD=3.3 Volts), with a 4.5 Volt (V) maximum gate stress limit on its 150 Angstrom thick gate oxide. This limit is due to a silicon dioxide limit of 3 megavolts per centimeter (MV/cm). This OCD is capable of interfacing to a 5.0 Volt Transistor-Transistor (TTL) bus (not shown) via data output 24. That is, the low voltage 3.3 V OCD and a higher voltage 5.0 V device both interface to a common bus. In this mixed voltage technology/mixed voltage interface environment, the 3.3 Volt OCD can provide a logic-high signal having a magnitude of 3.3±10% V when it controls the bus. When a device having a 5 Volt power supply range controls the bus, the 3.3 V OCD's input/output (I/O) circuitry is subject to a signal on the bus having a magnitude of 5.0±10% V.

The OCD of FIG. 5 employs a floating N-Well 40 in combination with over-voltage feedback to prevent current leakage into the 3.3 V supply voltage VDD, when in the high impedance (HIZ) state, and to prevent latch-up. Current leakage into the 3.3 V supply is prevented by feeding back an overvoltage (greater than 3.3 V+Vt$_{PFET}$, where Vt$_{PFET}$ is the PFET threshold voltage) at DATA OUTPUT 24 to the gate of PFET 32 through PFETs 30 and 36. With the gate of PFET 32 at the same potential as DATA OUTPUT 24 and node B, PFET 32 is in the OFF state, and no DC current passes through PFET 32 into the 3.3 V supply. Voltage stress across the gate oxide of PFET 32 under these conditions is also eliminated. Placing the low-voltage OCD PFETs into a floating N-Well prevents the parasitic p-n junctions associated with the PFETs from becoming forward biased and potentially causing latch up when DATA OUTPUT 24 is driven higher than 3.3 V+V$_{be}$, where V$_{be}$ is the turnon voltage of the parasitic p-n junction diodes and has a value of approximately 0.7 V DC and 1.0 V AC.

Adams et al. also describe the use of stacked NFETs (34 and 12, or 26 arid 22) with the gate node of NFETs 34 and 26 coupled to VDD (3.3 V). The stacked topology reduces device degradation due to hot-electron effects when discharging a node driven high by a higher voltage device coupled to the data bus. For example, DATA OUTPUT 24 can reach a most positive up level (MPUL) of 5.5 V. With the gate of NFET 26 coupled to VDD (3.3 V), the drain of NFET 22 can reach a voltage of 3.3 V−Vt$_{NFET}$ (about 2.9 V), where Vt$_{NFET}$ is the threshold voltage for the NFET. This results in a gate stress of about 2.2 V and about 2.9 V across NFETs 26 and 22 respectively, which is well within the 4.5 V maximum allowable stress.

Additional OCD protection methods are also known. Many include interfacing a lower-voltage technology circuit with a bus that also interfaces with higher voltage components, and use the following concepts:

1. The low-voltage technology circuit is only capable of driving a logic-high signal equal in magnitude to its core voltage (VDD);
2. Over-voltage detection is accomplished with a PFET the gate electrode of which is tied to VDD of the lower-voltage technology;
3. The over-voltage may be fed back through one or more PFETs to turn off the OCD PFET pull-up to prevent sinking DC current into the lower-voltage technology's power supply;
4. The lower voltage technology employs the floating N-Well concept to prevent latch-up when the bus is being driven by a higher voltage device; and
5. The NFET topology is as described by Adams et al.

Improved methods of protecting CMOS devices including, but not limited to, OCDs are desired.

SUMMARY OF THE INVENTION

The present invention is a method and apparatus for operating a CMOS off-chip driver circuit. The circuit has an output terminal and a pull-up transistor. The pull-up transistor has a gate. The circuit has a logic-low output voltage and a logic-high output voltage.

The logic-low output voltage is applied to the gate of the pull-up transistor. A condition is detected in which the voltage of the output terminal is greater than a predetermined threshold voltage. The voltage applied to the gate of the pull-up transistor is raised to an intermediate level that is greater than the logic-low output voltage and less than the logic-high output voltage while the condition is detected.

OVERVIEW

Figure 1:
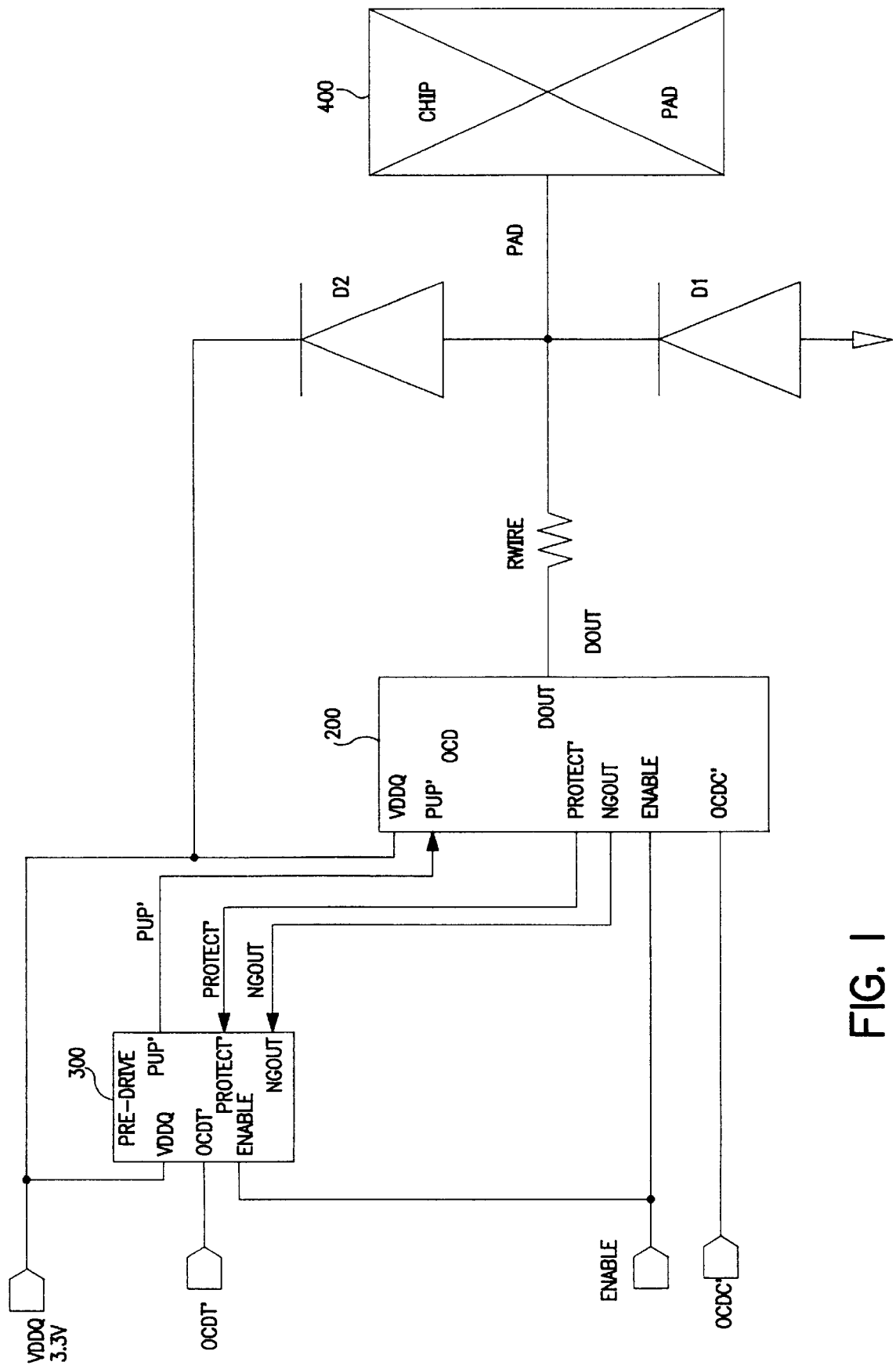
FIG. 1 is a block diagram, partly in schematic diagram form, of an exemplary apparatus according to the invention.
Figure 2:
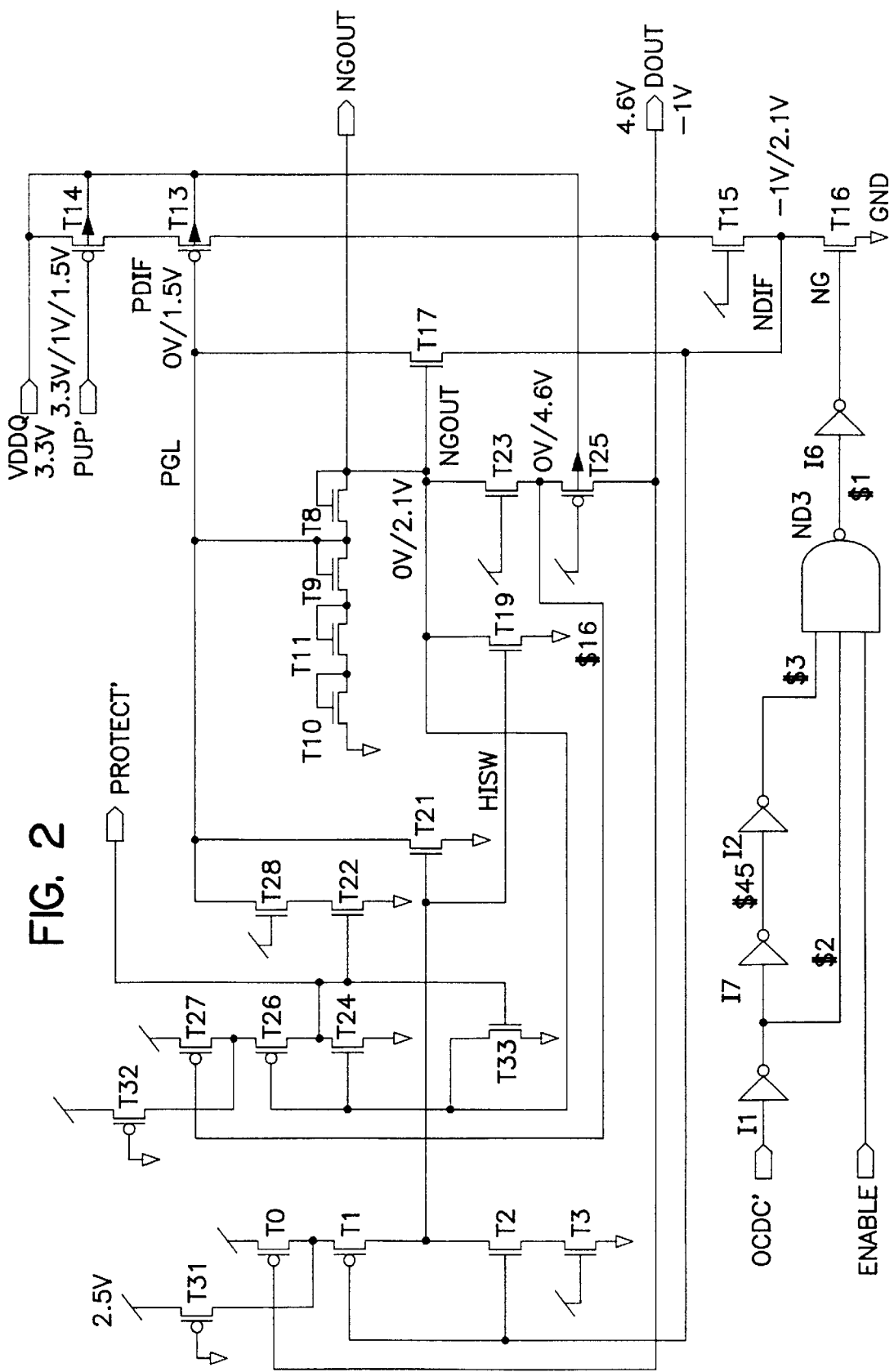
FIG. 2 is a schematic diagram of the off chip driver circuit shown in FIG. 1.
Figure 3:
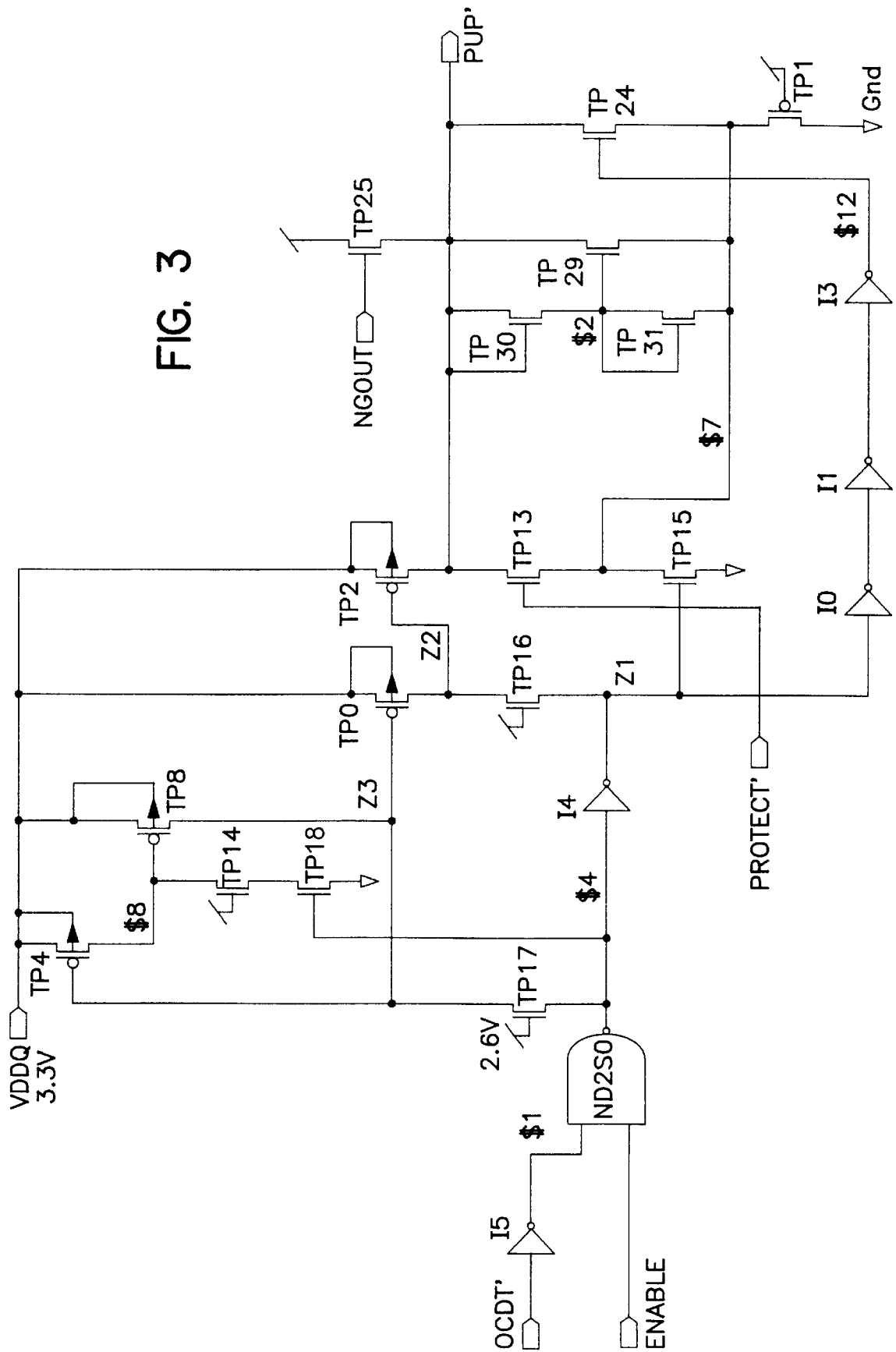
FIG. 3 is a schematic diagram of the Pre-driver circuit shown in FIG. 1.

The present invention is a CMOS off-chip driver circuit fabricated in a low voltage technology (which may be approximately 2.5 V) 200 and 300, as shown in FIGS. 1–3. Two pull-up transistors T13 and T14 are provided, each having a gate. Two pull-clown transistors T15 and T16 are provided. Voltage source means (VDDQ) are provided for providing voltage at a logic-high output voltage (which may be approximately 3.3 volts). An output terminal DOUT is provided. The signals PUE' and PGL apply a logic-low output voltage to the gate of each of the two pull-up transistors T13 and T14 while there is less than a predetermined threshold voltage (which may be approximately 3.1 V) between the gate and the source or drain of each pull-up transistor T13 and T14.

The PROTECT' signal provides means for detecting a condition in which the voltage of the output terminal is greater than a predetermined threshold voltage. The predetermined threshold voltage may be between approximately 2.5 volts (VDD) and approximately 3.3 volts (VDDQ).

The OCD 200 and the Pre-drive circuit 300 also provide means (via the signals PGL and PUP') for raising the voltage applied to the gate of the pull-up transistors T13 and T14, respectively, to an intermediate level (which may be 1.5 V) that is greater than the logic-low output voltage and less than the logic-high output voltage (which may be 3.3 V or VDDQ), while the condition is detected.

A clamping diode D2 is provided for sinking current from the output terminal DOUT to the voltage source VDDQ, when the voltage of the output terminal DOUT is greater than the logic-high output voltage 3.3 V+$V_{be}$. A further diode D1 is provided for sourcing current to the output terminal DOUT from a ground conductor GND, when the voltage of the output terminal is less than the logic-low output voltage $-V_{be}$.

According to the invention, dynamic dielectric protection circuitry is incorporated to prevent over stressing of gate oxides in the OCD, in which overshoot/undershoot peaks of −1 V to 4.6 V may occur before AC diode clamping begins. This allows the 2.5 V technology chip to drive a logic-high output signal having a magnitude of 3.3 V. In the mixed-voltage technology/single high-voltage interface environment, an over-voltage condition may result from transient reflections, and not from a higher voltage driver on the bus. Therefore, the floating N Well concept is not used in the exemplary circuits, and, where appropriate, N Wells are biased with VDDQ (3.3 V).

The exemplary embodiment of the invention operates on a 3.3 V LVTTL bus (±10%) and tolerates overshoots/undershoots of ±1 V (4.6 V/−1 V). Also, latch-up concerns from transient overshoots or undershoots are handled by device clamping (explained below) and guard rings. Further, it is desirable to sink current into the VDDQ supply during a transient overshoot or into the ground (GND) supply during a transient undershoot to help dissipate the reflected energy.

In advanced low-voltage CMOS technologies, the gate oxide film thickness is typically less than 50 Angstroms. The underlying mechanisms of dielectric breakdown in ultra thin films are as follows. The gate dielectric current causes generation of electron traps and interface states which lead to dielectric breakdown. As the dielectric thickness decreases, the density of traps required to induce breakdown decreases, affecting the reliability of the devices. The reliability of the dielectric layer may be modeled by the equation:

$$\text{Lifetime}=K*(I_g{}^n) \qquad (1)$$

where K is a constant, $I_g$ is the current at any given temperature, and n is a negative number having an absolute value greater than one. This behavior has been observed in a variety of CMOS devices, including a variety of compositions. This behavior has been observed in devices formed by a variety of methods, including Dry/Wet/Dry at 850° C., 800° C., 750° C., 700° C., as well as Dry oxide and nitrided oxide.

In advanced logic and SRAM applications, N+ polysilicon gates are used for NFETs, and P+ polysilicon gates are used for PFETs. The defect generation rate in the PFETs is quite different from that in the NFETs. The dielectric current at any given voltage and temperature conditions is much lower for the PFETs than the NFETs. Also, it has been determined that the lifetime for the P+ polysilicon gated ultra-thin dielectric, is generally higher than that for the N+ polysilicon gated dielectric under the same voltage, thickness and temperature. Thus, the magnitude of the parameter n in equation (1) is significantly higher for the P+ polysilicon gated dielectric than for the N+ polysilicon gated dielectric.

Based on the above described reliability model for ultra thin dielectric, the breakdown model is centered around the gate current. Thus, under conditions in which the gate dielectric is exposed to the maximum power supply voltage differential Vmax (3.6 V), the lifetime or reliability of the gate dielectric depends directly on the direct tunneling current in the voltage region of less than 3.0 Volts.

The reliability model for ultra thin dielectric shows that for both the NFETs and PFETs, the dielectric lifetime is larger under the accumulation condition than under the inversion condition. For the NFETs, the inversion condition occurs when the device is ON, i.e., when the gate is biased positive relative to the source and drain diffusions. The accumulation condition occurs when the gate is OFF, i.e., when the gate is biased negative relative to the source and drain diffusions. For the PFETs, all voltage bias polarities are reversed. The higher lifetime for the NFETs and PFETs under surface accumulation condition may be explained by the model which shows that the gate current at a given voltage and temperature condition is smaller under accumulation than under inversion.

In accordance with the invention, the above findings for the new dielectric model are used in a method and apparatus for protecting OCDs which are subject to Vmax, the maximum voltage used on the bus. An important concept for the exemplary embodiments of the invention is that the PFETs have a higher lifetime, at any given voltage condition, than the NFETs. Further, the reliability of PFETs also is more strongly dependent on gate current. Thus, the most reliable way to design the OCDs is by minimizing occurrences where the NFET dielectric is subjected to Vmax under the inversion condition.

In contrast to the method and apparatus described by Adams et al., the exemplary embodiment of the present invention allows a higher maximum gate stress limit due to technology advancements and the use of polysilicon gate contacts. In the 2.5 V CMOS technology used to fabricate the circuits of the exemplary embodiment, the 45 Angstrom thick oxide together with the polysilicon gate contact has a 3.6 V maximum DC stress limit at 125° C. and 100,000 POHs which is equivalent to 8 MV/cm. The oxide is not subjected to the entire 3.6 V stress due to depletion in the polysilicon gate contact. The stress across the physical oxide under these conditions is about 6.7 MV/cm. With a 3.6 V DC stress limit, the exemplary OCD is operable at 3.3 V±10% instead of 2.5 V.

DETAILED DESCRIPTION

FIG. 1 is a block diagram of the exemplary 3.3 V Low Voltage TTL (LVTTL) OCD 200 and Pre-Drive circuit 300. This circuit uses 2.5 V to 3.3 V voltage translation (performed by the Pre-driver 300). The inputs to the Pre-Drive circuit 300 include the 3.3 V power supply conductor VDDQ, the data control signal OCDT' and the tristate signal ENABLE. The Pre-Drive Circuit 300 also receives feedback control signals NGOUT and PROTECT' from the OCD 200, which are used to indicate to the Pre-drive circuit 300 that the voltage of PAD 400 is greater than a threshold value (3.1 V the example). When the PROTECT' signal is active (the logic-low state), OCD circuit 200 and Pre-drive circuit 300 raise the voltage of nodes PGL and PUP', respectively, from 0.0 to about 1.5 V. Modulation (explained in greater detail below) of these voltages protects the gate dielectric layer of the pull-up PFETs of OCD 200 when an over-voltage condition is present at node DOUT.

The inputs to OCD 200 include the power supply voltage VDDQ, data signal OCDC', and the Enable signal. OCD 200 also receives the pull-up control signal PUP' from Pre-Drive 300. When the PUP' signal is modulated to a voltage of 1.5 V, a source or drain voltage of up to 5.1 V can be tolerated without violating the gate dielectric layer's maximum voltage constraints. The OCD 200 also outputs the PROTECT' and NGOUT signals to the Pre-drive circuit 300. The OCD 200 outputs the data signal DOUT over a wire, having a resistance RWIRE, to the data bus chip pad PAD 400 when OCD 200 controls the bus. A pair of electrostatic discharge (ESD) diodes D1 and D2 clamp the bus signal to prevent the transmission of excessive over-cottages at node PAD to the DOUT terminal of OCD 200. The signals shown in FIG. 1 are described in detail below.

The states of the bus signal DOUT are as set forth below in Table 1.

TABLE 1

| OCDT' | OCDC' | DOUT |
|---|---|---|
| 0 | 0 | Illegal |
| 1 | 0 | 0 |
| 0 | 1 | 1 |
| 1 | 1 | HIZ |

PRE-DRIVE CIRCUIT

With reference to FIGS. 2 and 3, the exemplary embodiment uses 2.5 V to 3.3 V voltage translation to turn off the PFET T14 in the OCD 200 pull-up stack (FIG. 2). This function is performed by the voltage translation circuitry in the Pre-drive circuit 300 (FIG. 3), which includes PFETs TP0, TP4 and TP8, and NFETs TP14, TP16, TP17 and TP18. This circuitry also isolates the 2.5 V supply from the 3.3 V supply, thus preventing a power wasteful 3.3 V to 2.5 V DC current draw.

When either OCDT' or ENABLE is inactive corresponding to OCDT' logic-high or ENABLE logic-low, respectively), the output $4 of NAND gate ND2SO is in the logic-high (2.5 V) state. In this state, node Z3 is charged up through the NFET passgate TP17 to about 2.0 V (corresponding to VDD-$Vt_{NFET}$-body effect). With node Z3 at approximately 2.0 V, the gate-to-source voltage (Vgs) of PFETs TP4 and TP0 is reduced from the 3.3 V (when Z3 is at ground) to approximately 1.3 V (3.3 V-2.0 V) which substantially reduces the amount of current these devices can conduct. With the gate of NFET TP18 at VDD and TP4 in the reduced-current state described above, NFET stack TP14 and TP18 can easily pull node $8 low, thus turning on PFET TP8. When PFET TP8 turns on, the charging of node Z3 to 3.3V is completed, thus fully turning off PFETs TP4 and TP0.

Having node $4 in the logic-high state also results in the inverter I4 discharging nodes Z1 and Z2. Having node Z1 in the logic-low state turns off NFET TP15 and node Z2 going to the logic-low state turns on PFET TP2, which charges node PUP' to 3.3 V. As described in detail below with reference to FIG. 2, charging node PUP' to 3.3 V turns off the top PFET T14 in the OCD pull-up stack. Referring again to FIG. 3, isolation between the 3.3 V on node Z3 and the 2.5 V on node $4 is provided by NFET passgate TP17 which cuts off (stops conducting) when node Z1 is driven above VDD-$Vt_{NFET}$.

The opposite function occurs when OCDT' goes active (the logic-low state) and ENABLE is in the logic-high state. NAND gate NS2SO discharges node $4 to ground. When node $4 goes to the logic-low state, NFET TP18 turns off and node Z3 is discharged through NFET passgate TP17. When node Z3 goes low, PFETs TP4 and TP0 turn on. When TP4 turns on, node $8 charges up to 3.3 V, thus turning off PFET TP8. When TP0 is turned on, in combination with inverter I4 driving out a logic-high value, nodes Z2 and Z1 charge up to 3.3 V and 2.5 V respectively. NFET passgate TP16 cuts off once node Z1 is driven higher than VDD-$Vt_{NFET}$ and isolates the 3.3 V on node Z2 from the 2.5 V on node Z1. In this state, PFET TP2 is off and NFET TP15 is on, thus discharging node PUP' (which turns on PFET T14 in the OCD 200, described below with reference to FIG. 2).

OFF CHIP DRIVER

FIG. 2 is a detailed schematic diagram of the exemplary OCD 200. According to one aspect of the invention, the output signal DOUT to the databus chip pad 400 is fed back to the internal protection circuitry within the OCD 200. This feedback is used to dynamically alter the gate voltage applied to the respective gates of pull-up devices PFETs T13 and T14 (FIG. 2). According to the invention, overvoltage is detected and fed back to the OCD PFET pull-up transistor T13. The magnitude of the over-voltage feedback to the gate of the OCD PFET pull-up transistor T13 is stepped down. Thus, PFET pull-up transistors T13 and T14 (for which gate modulation is explained below) remain partially turned on and conduct current into the 3.3 V VDDQ supply during a transient overshoot. Leaving the OCD output stage PFETs partially turned on helps to clamp the magnitude of the overvoltage condition—a desirable effect.

Referring to FIG. 2, OCD 200 is a 3.3 V LVTTL driver. Initially, the gate drive voltage applied to the gates of PFETS T13 and T14 is set to 0 V. OCD 200 and Pre-driver 300 dynamically modulate node PGL and PUP', respectively to 1.5 V when the bus signal DOUT reaches about 3.1 V. The circuit is best: understood with reference to its operation and transition between various states, as described below.

HIZ to Logic-Low Transition

Referring again to FIG. 2, assume that the exemplary OCD 200 is tristated (corresponding to OCDC' and OCDT' each being in the logic-high state). Assume that another driver on the bus drives the node PAD (shown in FIG. 1) to the logic-high state and then tristates (releases the bus). Now assume OCDC' goes to the logic-low state. OCDC' is passed through inverter network I1, I7 and I2. The potential of node ENABLE, the output signal $3 of inverter I2, and the output signal $2 of inverter I1 are provided to NAND gate ND3. The output signal $1 of NAND gate ND3 is passed through inverter I6. The output signal NG of inverter I6 is applied to the gate of NFET T16. Thus, with OCDC' in the logic-low state and ENABLE in the logic-high state, NFET T16 is turned on and node DOUT is discharged to the logic-low state.

The node DOUT is coupled directly to the gate of PFET T0, and indirectly to the gate of PFET T1 via NFET T15. Because node DOUT is in the logic-low state, PFETs T0 and T1 (shown in FIG. 2) are turned on, which results in the node HISW being charged to VDD (=2.5 V). The potential at node HISW is applied to the gates of NFETs T21 and T19. With node HISW at 2.5 V, NFETs T21 and T19 are turned on, so that nodes PGL and NGOUT are pulled to ground. Node NGOUT is coupled directly to the gate of PFET T26, turning PFET T26 on. Node NGOUT is coupled to the gate of PFET T27 via NFET T23, turning PFET T27 on. Node PROTECT' is coupled to VDD by way of PFETs T32, T26 and T27.

Logic-Low to Logic-High Transition

Reference is again made to FIG. 2. Assume that DOUT has been driven to the logic-low state by the OCD 200, and that the OCD 200 is about to drive the system bus to the logic-high state. Node OCDC' goes to the logic-high state, turning off NFET T16. Node OCDT' goes to the logic-low state, causing the Pre-drive circuit 300 (shown in FIG. 1) to drive the Pre-drive signal PUP' to the logic-low state. The PUP' signal biases PFET T14 (shown in FIG. 2) ON. At this instant, the gate of PFET T13 is still being held at ground potential by its couplings to NFETs T21 and T22 (NFET T28 is used to weaken the pull-down strength of NFET T22).

With Node NDIF no longer coupled to ground and T14 turned on, the potential of node PDIF begins to rise. Node DOUT follows, as does node NDIF (minus a threshold voltage $Vt_{NFET}$). Thus, as the voltage on DOUT is applied to the gates of PFETs T0 and T1 and NFET T2, it turns off PFET T0 and turns NFET T2 on. Because the gate of NFET T3 is coupled to VDD and is always turned on, a complete path is formed coupling node HISW to ground via NFETs T2 and T3. Node HISW is also coupled to the gates of NFETs T21 and T19. Once node HISW goes to the logic-low state, NFETs T21 and T19 turn off. Nodes PGL and NGOUT are now held less firmly to ground by NFETs T22 and T33. In the exemplary embodiment, NFET T33 and PFETs T31 and T32 are long channel devices.

Once DOUT rises to a value of VDD+$Vt_{PFET}$+body effect (about 3.1 V), PFET T25 is turned on. As shown schematically in FIG. 2, the N well of PFET T25 is tied to VDDQ reverse biasing PFET T25 and raising its threshold voltage. Once DOUT reaches 3.1 V and T25 begins to conduct, the output of PFET T25 is applied to the gate of PFET T27. This turns off PFET 27, and node NGOUT is charged to a voltage of VDD−$Vt_{NFET}$ (approximately 1.9 V) by way of NFET T23. When node NGOUT goes to its logic-high state of 1.9 V, the potential of node NGOUT is applied to the gates of PFET T26 and NFET T24, turning NFET T24 on and turning PFET T26 off. Node PROTECT' goes to the active-low state, and the output of NFET T24 is also provided to the gates of NFETs T22 and T33, both of which turn OFF. Node NGOUT is also coupled to the gate of NFET T17, so that when NGOUT goes to its logic-high state of 1.9 V, NFET T17 is turned on. Because the potential of node NGOUT is approximately 1.9 V, NFET T17 can only pass approximately 1.5 V from node NDIF to node PGL. Node PGL is directly coupled to the gate of PFET T13, so that a 1.5 V potential is applied to the gate of PFET T13. With its gate at 1.5 V, PFET T13 is thus protected against overshoots up to 5.1 V, which is the sum of the 1.5 V gate potential plus the 3.6 V maximum gate-source voltage. NFETs T8, T9, T10 and T11 prevent nodes NGOUT and PGL from coupling up much higher than 1.9 and 1.5 V, respectively.

Reference is now made to FIG. 3, which is a schematic diagram of the Pre-drive circuit. With OCDT' in the logic-low state, and the enable signal at node ENABLE in a logic-high state, a logic-low signal is provided at the output of NAND gate ND2SO. This signal is inverted in inverter I4 to a logic-high signal at node Z1, which is applied to bias NFET TP15 on. When PROTECT' is inactive-high, node PUP' is pulled to ground by TP13 and TP15. The logic-high signal at node Z1 is passed through a network of inverters I0, I1 and I3, to provide a logic-low signal $12, which is applied to turn off NFET TP24. When PROTECT' goes to the active low-state, the potential of node PROTECT' is applied to the gate of NFET TP13, turning off TP13. With both NFETs TP13 and TP24 turned off, the Pre-drive signal PUP' is no longer held at ground. With the voltage of NGOUT at 1.9 V, NFET pull-up TP25 is turned on and pulls node PUP' up to 1.5 V. This is the same PUP' node that is coupled to the gate of PFET T14 (as shown in FIG. 2).

Referring again to FIG. 2, when the voltage of node PUP' and the gate of PFET T14 rise to 1.5 V, the gate dielectric of PFET T14 is protected for a source voltage of up to 5.1 V (which corresponds to a voltage differential $V_{GS}$ between the gate and source of up to 3.6 V). As described above, the gate dielectric of PFET T14 can tolerate 3.6 V DC. The gate dielectric of PFETs T13 and T14 can also tolerate transient (AC) over voltage magnitudes up to 4.2 V depending on the frequency and duty cycle of the over-voltage condition. When an overshoot voltage having a magnitude greater than VDDQ occurs at node PAD, the current between nodes DOUT and VDDQ reverses direction and is sunk into the VDDQ supply. In this case, voltage division determines the voltages that occur at the nodes DOUT and PDIF. If a voltage greater than VDDQ (i.e., greater than 3.3 V) is present on the P+ diffusions of PFETs T13 and T14, the threshold voltages of PFETs T13 and T14 are lowered, and their transconductance is increased. The overall effect is a lowering of the device channel resistance to the 25 to 30 ohm range which reduces the magnitude of the over voltage which occurs on nodes DOUT and PDIF. However, voltages in excess of 3.6 V may occur on nodes DOUT and PDIF, thus justifying the modulation of gate voltages on PFETs T13 and T14, as described above.

Logic-High to Logic-Low Transition

Referring again to FIGS. 2 and 3, if the OCD 200 drives the bus from the logic-high to the logic-low state, OCDT' (FIG. 3) is set to the logic-high state, and OCDC' (FIG. 2) is set to the logic-low state. In FIG. 3, when OCDT' is in the logic-high state, the signal $1 is in the logic-low state, signal $4 is in the logic-high state, node Z1 is in the logic-low state, turning off NFET TP15, and the voltage $12 from inverter I3 is in the logic-high state. Voltage $12 is applied to NFET TP24 so that TP24 is turned on.

The Pre-drive circuit 300 (FIG. 3) raises node PUP' to 3.3 V, which turns off PFET T14 in the OCD 200 (FIG. 2). PFET TP1 is configured as a clamp device which prevents node $7 from floating/capacitively coupling higher than about 3.0 V (VDD+Vt$_{PFET}$). This prevents a gate-to-drain stress greater than 3.6 V from occurring across NFET TP15 when Z1 is low. As shown in FIG. 2, when node OCDC' goes to the logic-low state, voltages $2 and $3 are in the logic-high state, $1 is in the logic-low state, and the logic level NG applied to the gate of NFET T16 is in the logic-high state, turning NFET T16 on, causing the voltage of node DOUT to fall. Nodes NGOUT and PROTECT' remain active (NGOUT is in the logic-high state and PROTECT' is in the logic-low state) until the voltage of node DOUT falls low enough (less than 1.4 V) to bias PFETS T0 and T1 on, in turn causing node HISW to switch to the logic-high state. When node HISW enters the logic-high state, NFETs T21 and T19 are turned on, so that nodes PGL and NGOUT are pulled to ground. The logic state of node NGOUT is applied to the gates of PFET T26 directly and PFET T27 by way of NFET T23, so that PFETs T26 and T27 are turned on. With both PFETs T27 and T26 turned on, node PROTECT' is raised to the voltage VDD.

HIZ to Logic-High Transition

Referring again to FIG. 3, the inverter string I0, I1 and I3 in Pre-drive circuit 300 is used when OCD 200 transitions from the HIZ state, and node PROTECT' is still active (in the logic-low state) when node OCDT' goes to the active (logic-low) state. This is the situation in which the output DOUT was tristated (HIZ) and the protection circuitry was already activated. This corresponds to beginning in the HIZ state with the output DOUT in the logic-high state and the protection circuitry already activated.

Without inverter network (I0, I1, I3) and NFET TP24, OCD 200 would come out of the HIZ state to drive a logic high, but would provide no drive to node DOUT since NFET TP13 (FIG. 3) is off when PROTECT' is low. To obviate this problem, the inverter network (I0, I1, I3) allows NFET TP24 to stay on for a short period of time (3 inverter delays) after OCDT' goes active (logic-low state) in order to discharge node PUP' from 3.3 V down to approximately 1.5 V which allows the OCD 200 to provide drive to the bus. Once NFET TP24 turns off, node PUP' is maintained at the 1.5 V level by NFET pull-up TP25, bleeder NFETs TP29, TP30, and TP31, and NFET TP15. The circuitry described above is used to prevent discharging node PUP' below 1.0 V when node PROTECT' is in the active (logic-low) state (i.e., when an over-voltage condition could be present on node DOUT).

OCD Overshoot Response

Figure 4:
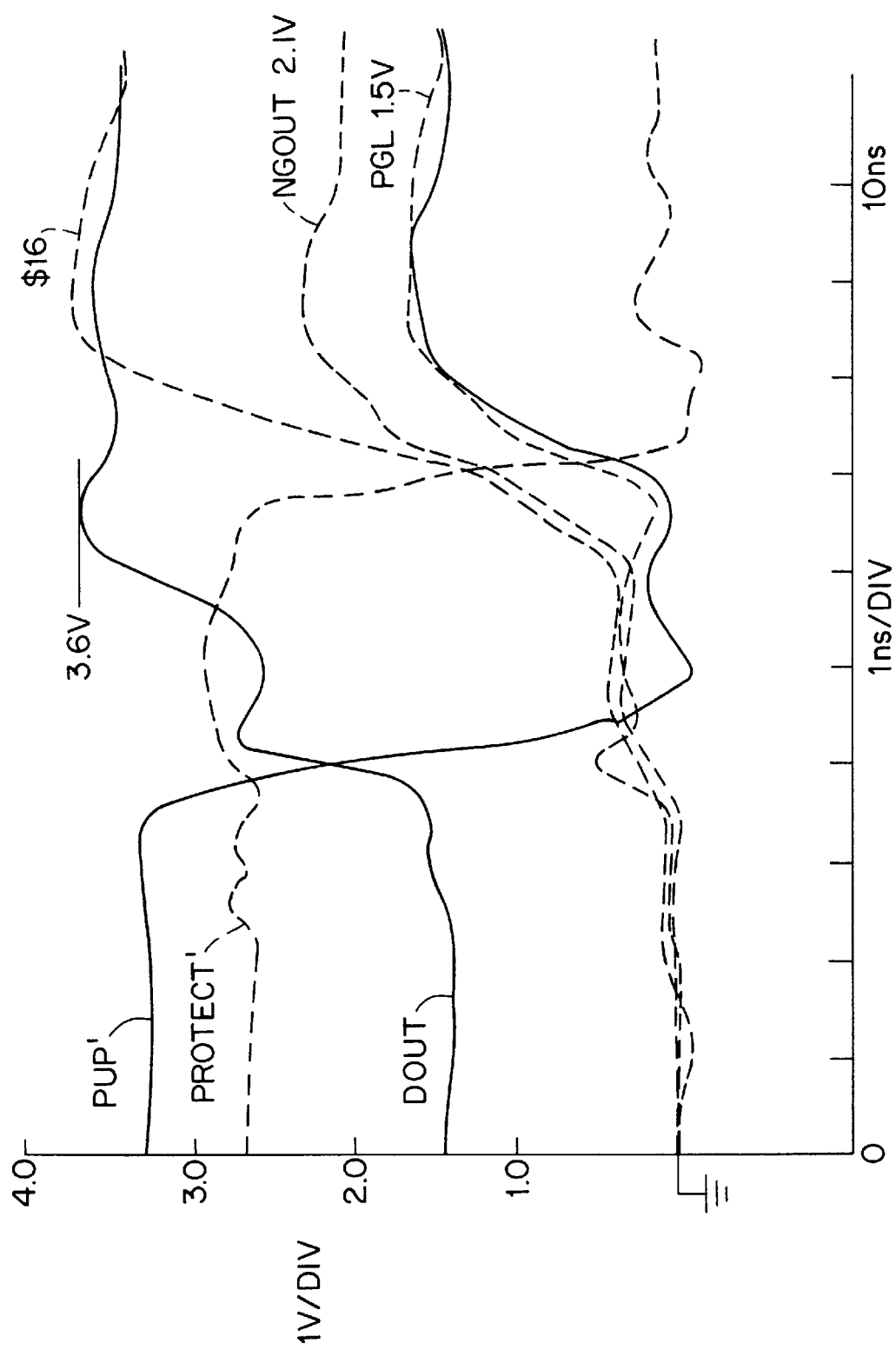
FIG. 4 is a diagram showing the voltage levels at various nodes within the apparatus of FIG. 1, as a function of time.
Figure 5:
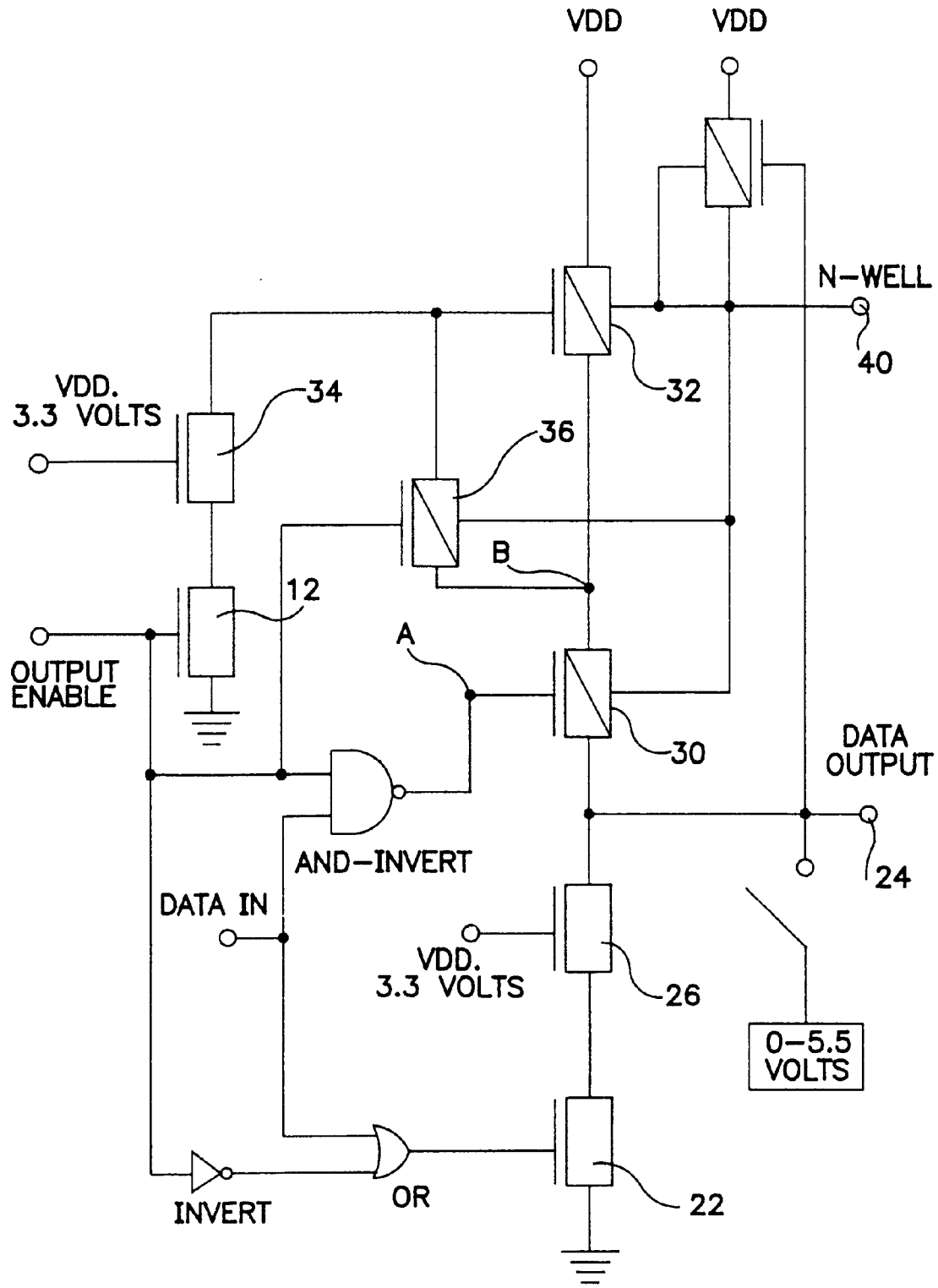
FIG. 5 is a schematic diagram of a conventional off chip driver circuit of the prior art.

FIG. 4 is a diagram showing a time plot of the voltage at various nodes in the OCD 200 as a function of time, while driving a logic-high state or "1". At the start, the Pre-drive signal PUP' on the top is in the logic-high state, and the driver is in the HIZ state. The output of the OCD 200 (node DOUT) is at a mid terminated level. This is the level which is a termination point between VDD and ground supplies. At this point in time, there is no need to protect the OCD devices, because an over-voltage has not occurred.

The node PROTECT', which is an active-logic-low, inactive-logic-high signal is shown. At the left side of FIG. 4 (time zero) PROTECT' is in the logic-high state, because the protection circuitry is turned off. Also shown are the nodes NGOUT and PGL which are two internal nodes to the OCD. NGOUT and PGL are in the logic-low state, which means the protection is turned off.

After about 3.5 nanoseconds, the driver is activated by the Pre-drive signal PUP' driving low to ground. At that point in time, the output DOUT starts to rise up. DOUT starts to drive and then it plateaus as it drives the system bus which has transmission line characteristics. Thus, DOUT plateaus about half way up and PUP' reaches ground at about 5 nanoseconds. After the reflection arrives, DOUT ultimately drives up to about 3.6 V at about 7 nanoseconds. Node PAD could ring up as high as 4.6 V resulting in a higher voltage magnitude at node DOUT than the 3.6 V peak shown in FIG. 4. Until the output DOUT reaches about 3.1 V, the protection circuitry remains turned off.

When DOUT reaches approximately 3.1 V, the OCD detects that an over-voltage is occurring, so that it is necessary to start protecting the driver circuits to minimize the stress in the PFET gate oxides. The nodes $16 and NGOUT start to rise up and the PROTECT' node starts to fall. When PROTECT' starts to fall, the OCD protect circuit is turning on. At the same time, the node NGOUT rises up to about 2.1 V causing the Pre-driver signal PUP' to rise up from ground to 1.5 V. Also the potential at the PGL node also rises up to 1.5 V.

With PGL and PUP' at 1.5 V, the allowable over-voltage at the output DOUT could be well above 3.6 V, specifically, 3.6+1.5 V for a maximum reflected over-voltage.

To summarize, after the node PAD drives high, the protection circuitry turns on at a certain level, and the gates of both PFET devices in the pull-up are dynamically modulated from ground (where they have their maximum drive), to a mid-level voltage.

By doing the dynamic modulation—by allowing the pull-up PFET gates to be at ground initially and only raising them as the over-voltage is occurring, the PFETs are allowed to have maximum drive at the initial point when the driver just turns on. This allows OCD designs with smaller device sizes, minimizing the output capacitance. It also speeds up the circuit performance.

A 3.3 V LVTTL OCD circuit has been described herein which dynamically modulates the PFET pull-up gate drive signal PUP' when the bus signal DOUT reaches 3.1 V. By initially providing zero volts to drive the gates of PFETs T13 and T14, with subsequent modulation to 1.5 V, 300 picosecond faster performance may be obtained compared to using an unmodulated 0.8 V gate drive with the same size PFETs. Benefits of leaving the PFET pull-ups T13 and T14 partially on (Vg$_{PFET}$=1.5V) when driving a logic-high output signal (DOUT) include:

(1) Gate stress is reduced in the gate dielectric of PFETs T13 and T14, extending the dielectric life time;

(2) Better overshoot clamping is provided;

(3) The PFET pull-ups T13 and T14 are able to drive the bus output signal DOUT even in the case where ringback or bus contention (which partially discharges the bus) is present; and (4) Faster device turn off is achieved when transitioning to the HIZ state or driving a zero.

One of ordinary skill in the art will recognize that the invention is not limited to SRAM devices, but is applicable across a wide range of CMOS devices, including microprocessors, dynamic read only memories (DRAMs), liquid crystal display (LCD) drivers, and other very large scale integrated (VLSI) devices.

Further, although the exemplary embodiment includes a CMOS circuit operating at 2.5 V with level translation to 3.3 V, one of ordinary skill in the art will recognize that the invention may also be embodied in other mixed voltage technology/ single high voltage interface systems. In particular, the core technology of the driver circuit may be of a first type having a supply voltage different from 2.5 V, and the single high-voltage interface may correspond to a second type of technology having a higher supply voltage than the first type, wherein the supply voltage of the second technology is different from 3.3 V. Although the exemplary embodiment turns on the gate protection circuitry when the pad voltage reaches approximately 3.1 volts, one of ordinary skill recognizes that other threshold voltages greater than VDD of the lower voltage technology and less than the supply voltage of the higher voltage technology may also be used. Although the exemplary gate voltage for the pull-up PFETs T13 and T14 is raised to an intermediate voltage of approximately 1.5 V when the protection circuitry is active, other gate voltages may also be used.

In the exemplary embodiment, the gate voltages of the pull-up PFETs are modulated to protect the gate dielectric. One of ordinary skill recognizes that, in a system (such as complementary transistor logic, or CTL) in which the two different technologies used have respectively different voltages for the logic-low level, a similar technique may be used to modulate the voltage applied to the pull-down NFETs to protect the gate dielectric of the NFETs.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A method of operating a CMOS off-chip driver circuit having an output terminal and a pull-up transistor, the pull-up transistor having a gate, the circuit having a logic-low output voltage and a logic-high output voltage, the logic-high output voltage determined by a first voltage of a first power supply, and the circuit operated by a second voltage of a second power supply, the first voltage being higher than the second voltage, the method comprising the steps of:
   (a) applying the logic-low output voltage to the gate of the pull-up transistor to turn on the pull-up transistor;
   (b) detecting a condition in which a voltage of the output terminal is greater than a predetermined threshold voltage; and
   (c) raising the voltage applied to the gate of the pull-up transistor to an intermediate level that is greater than the logic-low output voltage and less than the logic-high output voltage while the condition is detected thereby keeping the pull-up transistor on.

2. A method according to claim 1, wherein the predetermined threshold voltage is greater than the second voltage and less than the logic-high output voltage.

3. A method according to claim 2, wherein the intermediate level is approximately half way between the logic-low output voltage and the logic-high output voltage.

4. A method according to claim 3, wherein the logic-high output voltage is approximately 3.3 volts, the predetermined threshold voltage is approximately 3.1 volts, the second voltage is 2.5 V, the first voltage is approximately 3.3 volts, and the intermediate level is approximately 1.5 volts.

5. A method according to claim 1, wherein the pull-up transistor has a source and an n-well both connected to the first power supply, further comprising the step of
   (d) sinking current from the output terminal into the first power supply, when the voltage of the output terminal is greater than the logic-high output voltage.

6. A method according to claim 1, wherein a pull-down transistor is coupled between the output terminal and a ground terminal, further comprising the step of
   (d) sourcing current to the output terminal from the ground terminal when the voltage of the output terminal is less than the logic-low output voltage.

7. A method according to claim 1, wherein the CMOS off-chip driver circuit has an additional pull-up transistor, the additional pull-up transistor having a gate, the pull-up transistor and the additional pull-up transistor being connected in series between the first power supply and the output terminal, wherein:
   step (a) includes applying the logic-low output voltage to the gate of the additional pull-up transistor, and
   step (c) includes raising the voltage applied to the gate of the additional pull-up transistor to the intermediate level while the condition is detected.

8. An off-chip driver circuit, comprising:
   a first power supply having a first voltage for providing a logic-high output voltage;
   a second power supply having a second voltage for operating the circuit,
   a pull-up transistor having a source connected to the first power supply and a gate,
   an output terminal for providing a logic-low output voltage and the logic-high output voltage,
   means for applying the logic-low output voltage to the gate of the pull-up transistor to turn on the pull-up transistor;
   means coupled to the output terminal for detecting a condition in which the voltage of the output terminal is greater than a predetermined threshold voltage; and
   means coupled to the gate of the pull-up transistor for raising the voltage applied to the gate to an intermediate level that is greater than the logic-low output voltage and less than the logic-high output voltage while the condition is detected thereby keeping the pull-up transistor on.

9. A circuit according to claim 8, wherein the predetermined threshold voltage is greater than the second voltage and less than the logic-high output voltage.

10. A circuit according to claim 9, wherein the intermediate level is approximately half way between the logic-low output voltage and the logic-high output voltage.

11. A circuit according to claim 10, wherein the logic-high output voltage is approximately 3.3 volts, the predetermined threshold voltage is approximately 3.1 volts, the second voltage is 2.5 V, and the intermediate level is approximately 1.5 volts.

12. A circuit according to claim 11, further comprising pre-drive circuit means for translating a 2.5 volt data signal to a 3.3 volt output signal.

13. A circuit according to claim 8, wherein the pull-up transistor has an n-well connected to the first power supply, both sinking current from the output terminal to said first power supply when the voltage of the output terminal is greater than the logic-high output voltage.

14. A circuit according to claim 8, further comprising:
   a ground terminal; and
   a pull-down transistor coupled between the output terminal and the ground terminal for sourcing current to the output terminal from the ground conductor when the voltage of the output terminal is less than the logic-low output voltage.

15. A CMOS off-chip driver circuit, comprising:
   a first power supply for supplying a first voltage at a logic-high output voltage of approximately 3.3 volts;
   a second power supply for supplying a second voltage of approximately 2.5 volts for powering said circuit;

an output terminal for providing a logic-low output voltage and the logic-high output voltage;

a ground terminal;

two pull-up transistors connected in series between the first power supply and the output terminal each having a gate;

a pull-down transistor connected between the output terminal and the ground terminal;

means coupled to the gates of the pull-up transistors for applying a logic-low output voltage to the gates to turn-on the pull-up transistors;

means coupled to the output terminal for detecting a condition in which the voltage of the output terminal is greater than a predetermined threshold voltage, the predetermined threshold voltage being between approximately 2.5 volts and approximately 3.3 volts;

means coupled to the gates of the pull-up transistors for raising the voltage applied to the gates to an intermediate level that is greater than the logic-low output voltage and less than the logic-high output voltage while the condition is detected thereby keeping the pull-up transistor on;

wherein said pull-up transistors sink current from the output terminal to the first power supply when the voltage of the output terminal is greater than the logic-high output voltage; and said pull-down transistor sources current to the output terminal from the ground conductor when the voltage of the output terminal is less than the logic-low output voltage.

* * * * *